US009628063B2

United States Patent
Shen et al.

(10) Patent No.: US 9,628,063 B2
(45) Date of Patent: Apr. 18, 2017

(54) ASYMMETRICALLY-SWITCHED MODULATION SCHEME

(71) Applicants: Dan Shen, Austin, TX (US); Frank Cheng, Austin, TX (US); Lingli Zhang, Austin, TX (US)

(72) Inventors: Dan Shen, Austin, TX (US); Frank Cheng, Austin, TX (US); Lingli Zhang, Austin, TX (US)

(73) Assignee: CIRRUS LOGIC, INC., Austin, TX (US)

( * ) Notice: Subject to any disclaimer, the term of this patent is extended or adjusted under 35 U.S.C. 154(b) by 482 days.

(21) Appl. No.: 13/966,155

(22) Filed: Aug. 13, 2013

(65) Prior Publication Data

US 2014/0294206 A1   Oct. 2, 2014

Related U.S. Application Data

(60) Provisional application No. 61/805,753, filed on Mar. 27, 2013.

(51) Int. Cl.
| | |
|---|---|
| *H03K 7/00* | (2006.01) |
| *H03F 3/183* | (2006.01) |
| *H03F 3/217* | (2006.01) |
| *H03K 7/06* | (2006.01) |
| *H03K 7/08* | (2006.01) |

(52) U.S. Cl.
CPC .............. *H03K 7/00* (2013.01); *H03F 3/183* (2013.01); *H03F 3/2173* (2013.01); *H03K 7/06* (2013.01); *H03K 7/08* (2013.01); *Y10T 307/25* (2015.04)

(58) Field of Classification Search
CPC .......... Y10T 307/25; H03K 7/00; H03K 7/06; H03K 7/08; H03F 3/183; H03F 3/2173; H03F 3/181
USPC .................. 381/120; 332/108, 109, 112, 115; 307/11; 330/251; 327/175
See application file for complete search history.

(56) References Cited

U.S. PATENT DOCUMENTS

| | | | |
|---|---|---|---|
| 6,211,728 B1 | 4/2001 | Chen et al. | |
| 7,339,425 B2 | 3/2008 | Yang | |
| 7,746,155 B2 | 6/2010 | Labbe | |
| 8,013,677 B2 | 9/2011 | Kaya et al. | |
| 2006/0208715 A1* | 9/2006 | Saeki ................... | H02M 3/1588 323/282 |
| 2007/0176660 A1* | 8/2007 | Andersen .............. | H03F 3/2173 327/175 |
| 2011/0140774 A1* | 6/2011 | Kaya ..................... | H03F 3/2173 330/124 R |

(Continued)

*Primary Examiner* — Duc Nguyen
*Assistant Examiner* — Yogeshkumar Patel
(74) *Attorney, Agent, or Firm* — Norton Rose Fulbright US LLP

(57) ABSTRACT

An asymmetric modulation scheme may be used to drive two output nodes coupled to a load. The asymmetric modulation scheme may be one-sided such that the switching rate of a first output node is lower than the switching rate of a second output node. The first output node may be switched only to change a direction of current between the first output node and the second output node, while the second output node is switched to convey the information of an input signal. The asymmetric modulation scheme may be used to drive a speaker to reduce noise at the first output node to improve accuracy of current monitoring through the speaker by a current monitor coupled at the first output node.

36 Claims, 5 Drawing Sheets

(56) References Cited

U.S. PATENT DOCUMENTS

2013/0038391 A1* 2/2013 Hlibowicki .......... H03F 3/2173
330/251

* cited by examiner

US 9,628,063 B2

ASYMMETRICALLY-SWITCHED MODULATION SCHEME

CROSS-REFERENCE TO RELATED APPLICATIONS

This application claims the benefit of priority of U.S. Provisional Patent Application No. 61/805,753 to Dan Shen et al. filed on Mar. 27, 2013, and entitled "Asymmetrical One Sided Pulse Width Modulation (PWM) Scheme for Improved Load Current Sensing," which is hereby incorporated by reference in its entirety.

FIELD OF THE DISCLOSURE

The instant disclosure relates to modulation schemes. More specifically, this disclosure relates to modulation schemes for producing sound at a speaker.

BACKGROUND

Pulse modulation schemes encode data as a series of digital pulses according to an input analog signal. One advantage of pulse modulation is that power loss in the switching devices is very low. Many switched amplifiers use a full-bridge configuration, which can provide positive or negative current to the load without a negative power supply or a DC (direct current)blocking capacitor. FIG. 1 is a graph illustrating various conventional pulse modulation schemes for full-bridge output stage. Data 102 may be encoded into a waveform 104 according to an out-of-phase modulation scheme. The waveforms 104A and 104B may be output to two nodes, and used to drive a load, such as a speaker or an antenna. Data 102 may alternately be encoded into a waveform 106 according to an in-phase modulation scheme. Data 102 may further be encoded into a waveform 108 according to a single-sided modulation scheme.

Modulated data may, in some systems, be applied to a load to convey the data. For example, the modulated data may be output to a speaker when the encoded data is audio data to deliver audio sounds to a user of a device. In certain applications, it is may be desirable to monitor the current that is flowing through the load with high precision. FIG. 2 is a circuit diagram illustrating a conventional amplifier arrangement for a speaker with current monitoring. A circuit 200 includes a speaker 202 coupled to a first driver 204 and a second driver 206. A resistor 208 may be coupled between the speaker 202 and the first driver 204 to allow current monitoring through the speaker 202. A current monitor 210 is coupled to the resistor 208 to measure, for example, a voltage across the resistor. The current monitor 210 may include diodes 212 to provide protection, such as electrostatic discharge (ESD) protection. The diodes 212 may also include parasitic diodes associated with any switch inside the current monitor 210.

The drivers 204 and 206 may receive input waveforms having modulated data and amplify the input waveforms to produce output at the speaker 202. For example, the drivers 204 and 206 may switch transistors 204A or 206A to an on state to connect a first output node, $Out_p$, or a second output node, $Out_m$, respectively, to a positive voltage rail, $V_{DD}$. The drivers 204 and 206 may also switch on transistors 204B or 206B to connect the first output node, $Out_p$, or the second output node, $Out_m$, respectively, to a negative rail, such as ground. The difference between the first output node, $Out_p$, and the second output node, $Out_m$, generates a current through the speaker 202, which conveys the waveform to the user as an audible sound.

When the input waveforms to the drivers 204 and 206 are encoded according to conventional encoding schemes, such as those illustrated in FIG. 1, the output signals $out_p$ and $out_m$ may exceed a positive supply voltage, $V_{DD}$, or fall below a negative supply voltage, gnd, which reduces the accuracy of the current monitor 210. First, during a high-to-low or low-to-high transition of $out_p$ or $out_m$, overshoot and undershoot may occur, which may cause $out_p$ or $out_m$ to exceed $V_{DD}$ or fall below gnd. Second, during a steady state of $out_p$ and $out_m$, $out_p$ and $out_m$ may exceed $V_{DD}$ or gnd. For example, when $out_p$ is connected to $V_{DD}$ for a period of time while load current at the time is flowing into the $out_p$ node, then $out_p$ may exceed $V_{DD}$ for a voltage of $I_{load}*Z_{PMOS}$, where $I_{load}$ is the current through the speaker 202 and $Z_{PMOS}$ is the impedance of the PMOS components of the drivers 204 and 206. Likewise, the same occurs when $out_p$ is connected to gnd but current flows out of $out_p$. Depending on the load current amplitude and switch size, the overshoot or undershoot during the steady-state period may exceed one volt. If the output node, $out_p$, which is coupled the current monitor 210, exceeds $V_{DD}$ or below gnd, precision in the current monitor 210 may be lost. Forward-biasing the diode 212 may create current that will be sensed by the sense resistor 208 but does not actually flow to speaker 202, thus reducing the precision of the current monitor 210. If there are switched capacitor circuits used as an interface for the current monitor 210, charge spill may happen as the result of $out_p$ exceeding $V_{DD}$ or below gnd, which may affect the precision of the current monitoring circuit.

Shortcomings mentioned here are only representative and are included simply to highlight that a need exists for improved integrated circuits, particularly for consumer-level devices. Embodiments described here address certain shortcomings but not necessarily each and every one described here or known in the art.

SUMMARY

In certain embodiments, the chance that a node from a switched amplifier used as input for a current monitoring circuit will exceed $V_{DD}$ or fall below a negative supply voltage, gnd, may be reduced by switching a node less frequently. Thus, current monitoring accuracy may be improved to provide a high fidelity measurement of load current through a sense resistor connected to that terminal. Distortion in the current monitoring circuit may be reduced through application of asymmetric waveforms to the load. For example, an asymmetric waveform may be applied to a speaker with a current monitoring circuit coupled to a first node of the speaker. The waveform applied to the first node of the speaker may be encoded with a reduced number of transitions. The waveform applied at a second node of the speaker may be encoded to substantially convey the encoded audio data. Although a speaker and current monitoring are described, an asymmetric encoding scheme may be applied to any load.

According to one embodiment, an apparatus may include a processor having a first input node, a first output node, and a second output node. The processor may be configured to receive at least one analog signal at the first input node. The processor may be also configured to modulate the first output node at a first potential when the received analog signal is larger than a first threshold value and at a second potential when the received analog signal is smaller than a second threshold value. The modulator may be further configured to modulate the second output node by switching the second output node between the first potential and the second potential corresponding to the received analog signal.

According to certain embodiments, the processor may be configured to modulate the first node and the second node asymmetrically, the processor may be configured to modulate the first output node and the second output node according to a pulse-width modulation (PWM) scheme, the processor may be configured to modulate the first output node and the second output node according to pulse-frequency modulation (PFM) scheme, the processor may be configured to modulate the first output node and the second output node according to a combination, and/or the processor may be configured to receive a differential signal at the input node.

The apparatus may also include a digital-to-analog converter (DAC) coupled to the first input node, the digital-to-analog converter comprising a digital input node having at least a two-bit input, an amplifier coupled to the processor, a speaker coupled to the amplifier, and/or a current monitor coupled to the amplifier and to the speaker.

According to another embodiment, a method may include receiving at least one analog signal. The method may also include driving a first output node at a first potential when the received analog signal is larger than a first threshold value and at a second potential when the received analog signal is smaller than a second threshold value. The method may further include driving a second output node by switching the second output node between the first potential and the second potential corresponding to the received analog signal.

In certain embodiments, the first output node and the second output node are driven asymmetrically, the first output node and the second output node are driven according to a pulse-width modulation (PWM) scheme, the first output node and the second output node are driven according to a pulse-frequency modulation (PFM) scheme, the first output node and the second output node are driven according to a combination of a pulse-width modulation (PWM) scheme and a pulse-frequency modulation (PFM) scheme, receiving two analog signals in a differential configuration, and/or receiving at least one analog signal from a digital-to-analog converter (DAC).

The method may also include driving current between the first output node and the second output node through a speaker and/or monitoring a current through the speaker.

According to a further embodiment, an apparatus may include means for receiving a signal. The apparatus may also include means for driving a first output node at a first potential when the received analog signal is larger than a first threshold value and at a second potential when the received analog signal is smaller than a second threshold value. The apparatus may further include means for driving a second output node by switching the second output node between the first potential and the second potential corresponding to the received analog signal.

In certain embodiments, the first driving means and the second driving means may generates an asymmetrical output between the first output node and the second output node, the apparatus may also include a speaker coupled to the first driving means and the second driving means, and/or the apparatus may also include a current monitoring device coupled to the speaker.

According to another embodiment, a method may include receiving a signal and modulating the signal onto a first node and a second node. The step of modulating may include driving the first node and driving the second node, in which the first node is driven asymmetrical from the second node.

In certain embodiments, the step of modulating the signal may include modulating the signal according to a pulse-width modulation (PWM) scheme, a first average voltage of the first node may be different from a second average voltage of the second node, the step of driving the first node may include switching a voltage of the first node to change a direction of current from the first node to the second node, the step of driving the second node may include switching a voltage of the second node to represent a change of amplitude of the received signal, the step of switching the first node may include switching the first node at a rate between approximately 0 hertz and approximately 20 kilohertz, the step of switching the second node may include switching the second node at a rate between approximately 200 kilohertz and approximately 2 megahertz, receiving the signal may include receiving an audio signal, and/or the step of monitoring current through the speaker may include measuring current at the first node.

The method may also include driving a speaker with current from the first node and the second node and/or monitoring current through the speaker.

According to a further embodiment, an apparatus may include a first driver configured to receive a first signal and to provide a first output to a first node, a second driver configured to receive a second signal and to provide a second output to a second node, and a processor coupled to the first driver and the second driver. The processor may be configured to perform the steps of outputting the first signal to the first driver and outputting the second signal to the second driver, in which the first signal is asymmetrical from the second signal.

In certain embodiments, the processor may be configured to modulate the first signal and the second signal according to at least one of a pulse-width modulation (PWM) scheme and a pulse-frequency modulation (PFM) scheme, a first average voltage of the first signal may be different from a second average voltage of the second signal, the processor may be configured to switch the first signal at a rate between approximately 0 Hertz and approximately 20 kilohertz, and/or the processor may be configured to switch the second signal at a rate between approximately 200 kilohertz and approximately 2 megahertz.

The apparatus may also include comprising a speaker coupled to the first node and to the second node, a resistor coupled to the first node and to the speaker, a current monitor coupled to the resistor, a first predriver coupled to the first driver, and/or a second predriver coupled to the second driver.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

Figure 3:
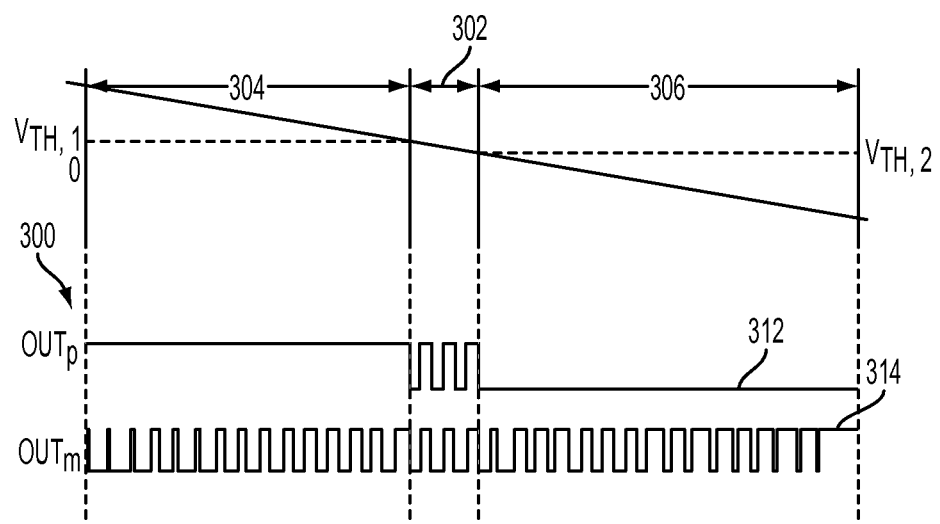
FIG. 3 is a graph illustrating a modulation scheme with asymmetric modulation modes according to one embodiment of the disclosure.

FIG. 3 is a graph illustrating a modulation scheme with asymmetric modulation modes according to one embodiment of the disclosure. A modulation scheme 300 may include asymmetric modes of operation within ranges 304 and 306. For example, when an input signal to a modulator is above a first threshold voltage, $V_{TH,1}$, or when an input signal to a modulator is below a second threshold voltage, $V_{TH,2}$, the input signal may be modulated asymmetrically between two output nodes. When a modulator is receiving an input signal with an amplitude within the ranges 304 and 306, the modulator may maintain one output node, such as $Out_p$, at a substantially constant voltage, shown in the waveform 312, and switch a second output node, such as $Out_m$, at a rate to convey information in the input signal, shown in the waveform 314. The switching of the second output node, $Out_m$, may occur based on a pulse-width modulation (PWM) scheme, a pulse-frequency modulation (PFM) scheme, or a combination of pulse-width modulation (PWM) and pulse-frequency modulation (PFM) schemes. The asymmetric modulation scheme reduces switching activity at the first output node, $Out_p$, and prevents $Out_p$ from exceeding a positive voltage supply, $V_{DD}$, or dropping below a negative power supply, gnd, to improve precision of the current monitoring circuit coupled to the first output node, $Out_p$. The value of the output at the first node, $Out_p$, may switch between operating in the range 304 and the range 306 to reverse a direction of current flow between the first output node to the second output node. That is, during operation of the modulator in the range 304, the voltage at the first output node may be driven to a first potential, and during operation of the modulator in the range 306, the voltage at the first output node may be driven to a second potential.

In a range 302, the input signal to the modulator is below the first threshold, $V_{TH,1}$, and above the second threshold, $V_{TH,2}$. In this range 302, the amplitude of the input signal may be too small to introduce glitches to the load when driven by the first output node, $Out_p$, and the second output node $Out_m$. The modulator may encode the input signal for output to the first output node, $Out_p$, and the second output node, $Out_m$, according to an asymmetric mode or another conventional mode, such as those illustrated in FIG. 1. According to one embodiment, the modulator may encode data using an in-phase modulation scheme when operating in the range 302.

Figure 1:
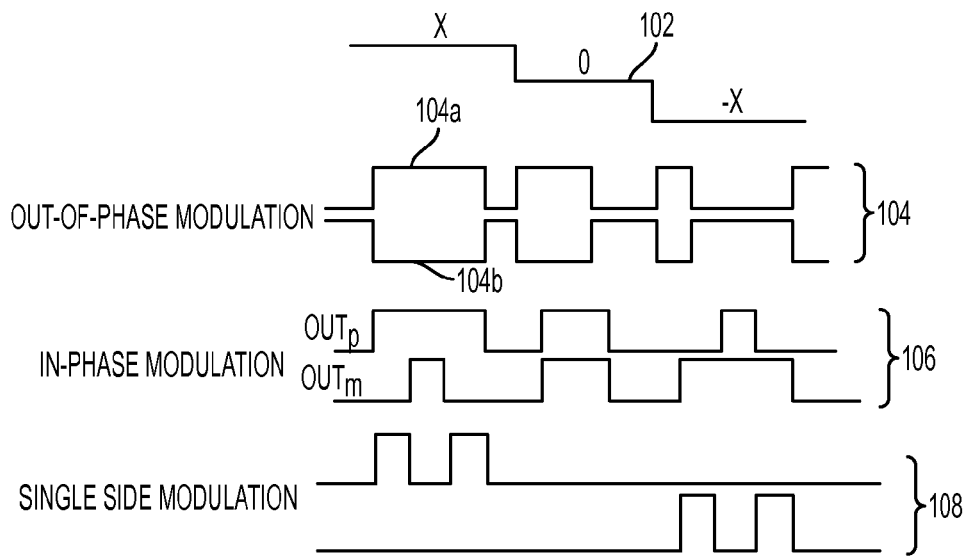
FIG. 1 is a graph illustrating conventional modulation schemes.
Figure 2:
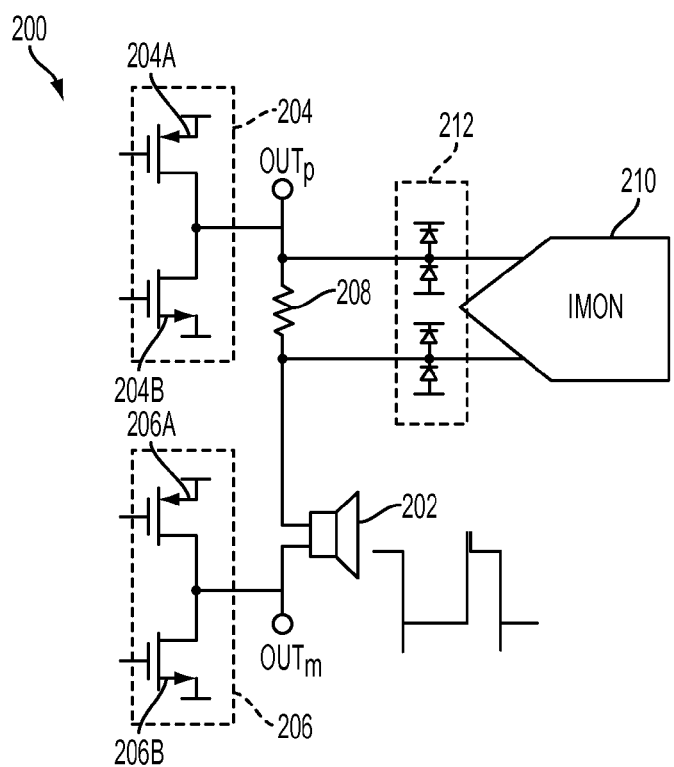
FIG. 2 is a circuit diagram illustrating a conventional speaker driver circuit with current monitoring circuit.

The modulation scheme of FIG. 1 may be applied to, for example, a class D amplifier system as shown in FIG. 2. This modulation scheme of FIG. 3 may reduce noise for components coupled to the first node $Out_p$. For example, when the modulation scheme is applied to a speaker load with a sense resistor to sense current through the speaker, less disturbance may occur at the input of the current monitoring circuit due to less switching at the first output node $Out_p$. Less switching within the amplifier occurs because the voltage at the first output node, $Out_p$, may only change polarity when the input signal changes polarity. By having the voltage at the first output node, $Out_p$, change with the polarity of the input signal, the change of the voltage at the first output node, $Out_p$, is less frequent compared with the prior art modulation schemes. Switching less frequently means $Out_p$ has a reduced chance of overshoot or undershoot during high-to-low or low-to-high transitions.

In conventional modulation schemes the output node $Out_p$ may exceed $V_{DD}$ or fall below gnd, even when $Out_p$ is at a steady-state value other than in the high-to-low or low-to-high transition. By using this modulation scheme, the voltages at node $Out_p$ may not receive a voltage value beyond the amplifier power supply rails, such as above $V_{DD}$ or below gnd, when $Out_p$ is at steady-state value. That is, the voltage at node $Out_p$ and the direction of the current going through the speaker load are synchronized when this current is large. In asymmetrical modulation, when $Out_p$ is connected to $V_{DD}$, current flows out of the $Out_p$ node, and while $Out_p$ is connected to gnd, current flows into $Out_p$, thus preventing $Out_p$ to be above $V_{DD}$ or below gnd. If using traditional modulation schemes, the voltage at nodes $Out_p$ and/or $Out_m$ may be more than one volt (1 Volt) beyond the power rails, which can create problems for any switches connected to these two nodes. By using this new modulation scheme, only small or no disturbances occur when the current is small, such as in the zone where signal is below the first threshold but larger than the second threshold. For speaker protection or speaker linearization, the current information obtained for the audio signal when the load current is very low is not as important as when the load current is large. Ringing voltage at nodes $Out_p$ or $Out_m$ caused by switching may also be much smaller when the load current is small.

Figure 4:
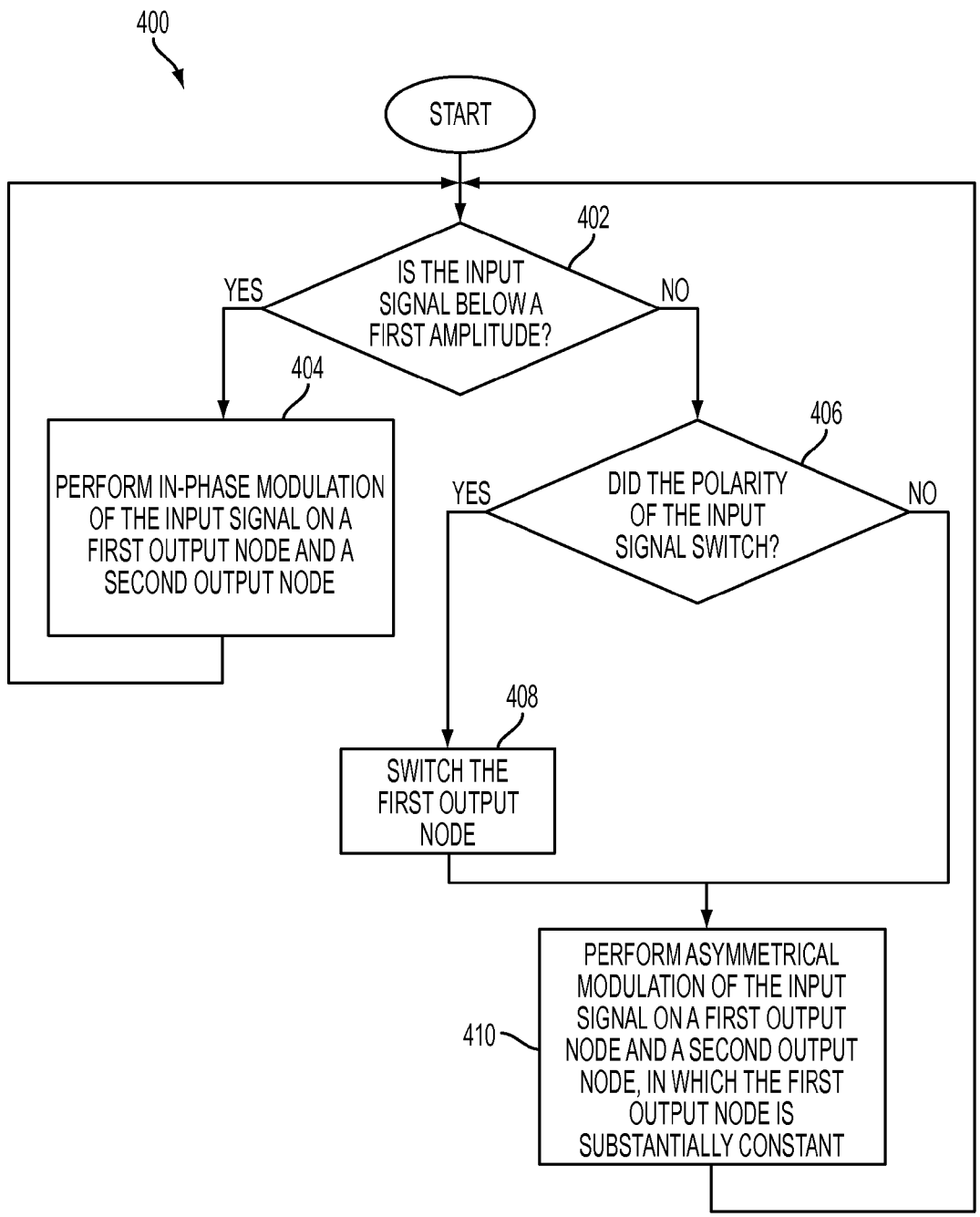
FIG. 4 is a flowchart illustrating a method of modulating an input signal according to one embodiment of the disclosure.

FIG. 4 is a flowchart illustrating a method of modulating an input signal according to one embodiment of the disclosure. A method 400 for modulating an input signal, such as an audio signal, may begin at block 402 with determining whether the input signal is below a first amplitude, such as between the thresholds $V_{TH,1}$ and $V_{TH,2}$. According to one embodiment, the determination of the amplitude of the input signal may be performed after low-pass filtering of the input signal in either the digital domain or the analog domain.

If the input signal is below a first amplitude, then the method 400 continues to block 404 to perform in-phase modulation of the input signal on a first output node and a second output node. Although in-phase modulation is shown at block 404, other modulation schemes may be used to encode the input signal when the input signal is below a first amplitude. The method 400 may return to block 402 to determine when the input signal exceeds the first amplitude.

If the input signal is not below a first amplitude, such as when the input signal is above the threshold $V_{TH,1}$ or below the threshold $V_{TH,2}$, the method 400 continues to block 406 to determine if the polarity of the input signal switched. If the polarity switched, then the polarity of the first output node is switched at block 408 and the method 400 continues to block 410. If the polarity did not switch, then the method 400 continues to block 410. At block 410, the method 400 performs asymmetric modulation of the input signal on a first output node and a second output node, in which the first output node is substantially constant. The method 400 may return to block 402 to determine when the input signal falls below the first amplitude.

Figure 5:
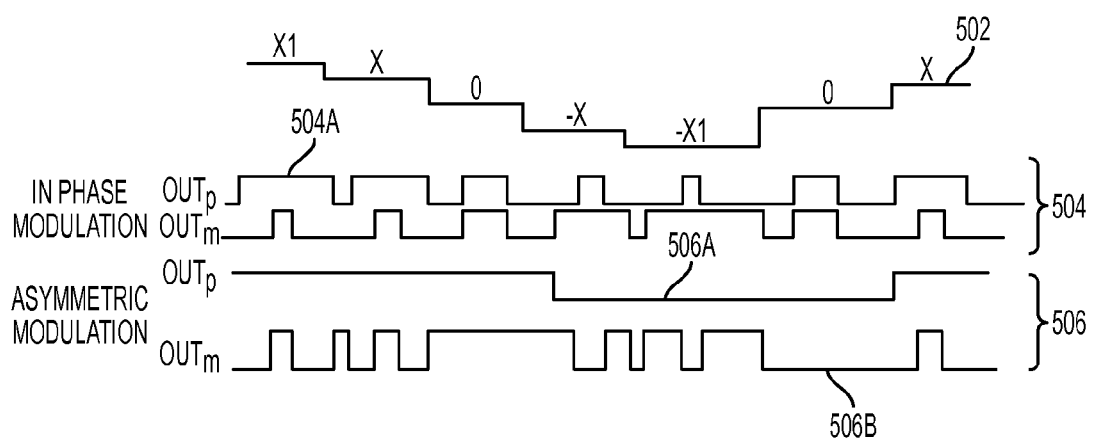
FIG. 5 is a graph illustrating an asymmetric modulation encoding of data according to one embodiment of the disclosure.

FIG. 5 is a graph illustrating an asymmetric modulation encoding of data according to one embodiment of the disclosure. A data signal 502 with several levels, $x_1$, x, 0, -x, and $-x_1$, may be encoded according to a conventional in-phase modulation scheme 504 or according to an asymmetric modulation scheme 506, such as that described above with reference to FIG. 3 and FIG. 4. The asymmetric modulation scheme 504 may be one-sided, such that switching of the first output node shown by 506A is reduced compared to switching of the second output node shown by 506B. Further, the switching of the first output node shown by line 506A for asymmetric modulation is reduced compared to the switching of the first output node of the conventional in-phase modulation scheme 504 shown by 504A. According to one embodiment, the switching rate of the first output node, $Out_p$, may be between approximately 0 hertz and approximately 20 kilohertz, while the switching rate of the second output node, $Out_m$, may be between approximately 200 kilohertz and 2 megahertz.

The modulation scheme described above with reference to FIG. 3, FIG. 4, and FIG. 5 may be applied to a circuit driving any load. In one embodiment, the modulation scheme may be used to encode data for an amplifier for a speaker integrated in a mobile device. The speaker may be coupled to a sense resistor and a current monitor to allow monitoring of current through the speaker and adjustment of the drive current to linearize the speaker of the mobile device.

Figure 6:
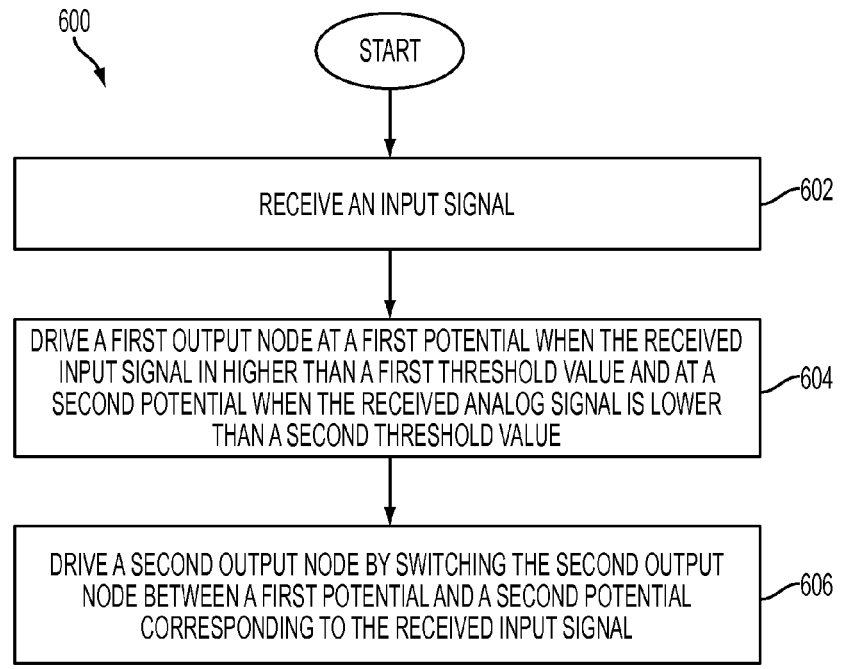
FIG. 6 is a flowchart illustrating a method of operating a driver circuit according to one embodiment of the disclosure.

FIG. 6 is a flowchart illustrating a method of operating a driver circuit according to one embodiment of the disclosure. A method 600 begins at block 602 with receiving an input signal, such as an audio signal. According to one embodiment, the input signal may be an analog signal received from a digital-to-analog converter (DAC). For example, a digital audio signal may be provided through a parallel interface to the DAC, such as in a multiple-bit word, from which an analog input signal is generated and input to the amplifier.

At block 604, a first output node is driven at a first potential when the received analog signal is higher than a first threshold value and at a second potential when the received analog signal is lower than a second threshold value. At block 606, a second output node is driven by switching the second output node between the first potential and the second potential corresponding to the received input signal. That is, the second output node is switched to convey the information of the input signal and the first output node is switched to control a direction of current between the first output node and the second output node.

Figure 7:
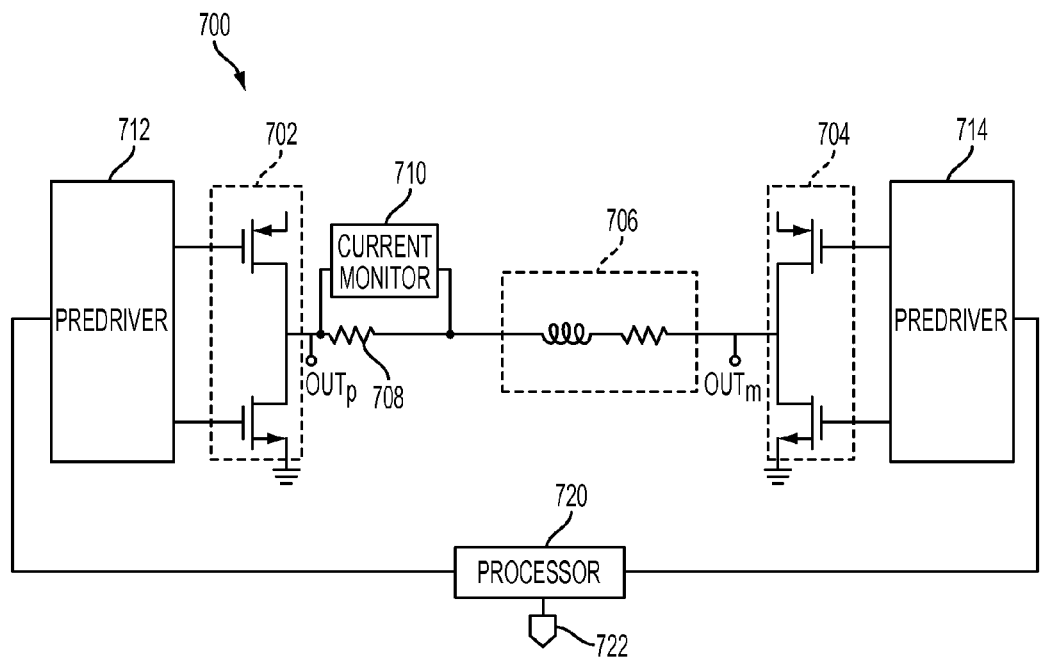
FIG. 7 is a circuit diagram illustrating a driver circuit for asymmetric modulation of a data signal onto a load according to one embodiment of the disclosure.

FIG. 7 is a circuit diagram illustrating a driver circuit for asymmetric modulation of a data signal onto a load according to one embodiment of the disclosure. A circuit 700 includes a load 706, which may be represented as a series combination of an inductance and a resistance. In one embodiment, the load 706 may be a speaker. The load 706 may be driven by a first output node, $Out_p$, and a second output node, $Out_m$. Circuitry may be coupled between the load 706 and the first output node, $Out_p$. In one embodiment, the circuitry may include a sense resistor 708 coupled to a current monitor 710. The current monitor 710 may include, for example, an analog-to-digital converter (ADC) to convert a voltage measured across the sense resistor 708 to a digital signal for processing by a processor.

A first driver 702 may drive the first output node, $Out_p$, and a second driver 704 may drive the second output node $Out_m$. In certain embodiments, a first predriver 712 may be coupled to the first driver 702, and a second predriver 714 may be coupled to the second driver 704. The predrivers 712 and 714 may receive signals from a processor 720, which processes an input signal received at an input signal node 722 by modulating the input signal for output by the drivers 702 and 704 onto the first output node, $Out_p$, and the second output node, $Out_m$, respectively. The processor 720 may include any circuit for modulating input signals, such as a modulator. The processor 720 may output a first signal and a second signal through a first output node and a second output node, which are the modulated waveforms, such as shown in waveforms 312 and 314 of FIG. 3. The first and second output nodes may be coupled to the predrivers 712 and 714, respectively.

The processor 720 may receive an input signal through an input signal node 722. The input signal may be processed by the processor 720 according to the description above provided with reference to FIG. 3, FIG. 4, FIG. 5, and FIG. 6. For example, the processor 720 may include circuitry for implementing the methods illustrated by the flow charts of FIG. 4 and FIG. 6. The processor 720 may alternately include generic processing circuitry and execute code for implementing the methods illustrated by the flow charts of FIG. 4 and FIG. 6.

If implemented in firmware and/or software, the functions described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. An apparatus, comprising:
   a processor comprising a first input node, a first output node, and a second output node,
   in which the processor is configured to:
   receive at least one analog signal at the first input node;
   modulate the first output node at a first constant potential when the received analog signal is larger than a first threshold value and at a second constant potential when the received analog signal is smaller than a second threshold value, wherein the first constant potential is different from the second constant potential; and
   modulate the second output node by switching the second output node between the first constant potential and the second constant potential corresponding to the received analog signal, wherein the second output node is switched between the first constant potential and the second constant potential while the first output node is held at either the first constant potential or the second constant potential.

2. The apparatus of claim 1, in which the processor is configured to modulate the first node and the second node asymmetrically.

3. The apparatus of claim 1, in which the processor is configured to modulate the first output node and the second output node according to a pulse-width modulation (PWM) scheme.

4. The apparatus of claim 1, in which the processor is configured to modulate the first output node and the second output node according to pulse-frequency modulation (PFM) scheme.

5. The apparatus of claim 1, in which the processor is configured to modulate the first output node and the second output node according to a combination of a pulse-width modulation (PWM) scheme and a pulse-frequency modulation (PFM) scheme.

6. The apparatus of claim 1, in which the processor is configured to receive a differential signal at the input node.

7. The apparatus of claim 1, further comprising a digital-to-analog converter (DAC) coupled to the first input node, the digital-to-analog converter comprising a digital input node having at least a two-bit input.

8. The apparatus of claim 1, further comprising:
   an amplifier coupled to the processor; and
   a speaker coupled to the amplifier.

9. The apparatus of claim 8, further comprising a current monitor coupled to the amplifier and to the speaker.

10. A method, comprising:
    receiving at least one analog signal;
    driving a first output node at a first constant potential when the received analog signal is larger than a first threshold value and at a second constant potential when the received analog signal is smaller than a second threshold value, wherein the first constant potential and the second constant potential are different; and
    driving a second output node by switching the second output node between the first constant potential and the second constant potential corresponding to the received analog signal, wherein the second output node is switched between the first constant potential and the second constant potential while the first output node is held at the first constant potential while the first output node is held at either the first constant potential or the second constant potential.

11. The method of claim 10, in which the first output node and the second output node are driven asymmetrically.

12. The method of claim 10, in which the first output node and the second output node are driven according to a pulse-width modulation (PWM) scheme.

13. The method of claim 10, in which the first output node and the second output node are driven according to a pulse-frequency modulation (PFM) scheme.

14. The method of claim 10, in which the first output node and the second output node are driven according to a combination of a pulse-width modulation (PWM) scheme and a pulse-frequency modulation (PFM) scheme.

15. The method of claim 10, in which the step of receiving at least one analog signal comprises receiving two analog signals in a differential configuration.

16. The method of claim 10, in which the step of receiving at least one analog signal comprises receiving at least one analog signal from a digital-to-analog converter (DAC).

17. The method of claim 10, further comprising driving current between the first output node and the second output node through a speaker.

18. The method of claim 17, further comprising monitoring a current through the speaker.

19. An apparatus, comprising:
    means for receiving a signal;
    means for driving a first output node at a first constant potential when the received signal is larger than a first threshold value and at a second constant potential when the received signal is smaller than a second threshold value, wherein the first constant potential is different from the second constant potential; and
    means for driving a second output node by switching the second output node between the first constant potential and the second constant potential corresponding to the received signal, wherein the means for driving the second output node switches the second output node between the first constant potential and the second constant potential while the first output node is held at either the first constant potential or the second constant potential.

20. The apparatus of claim 19, further comprising a speaker coupled to the first driving means and the second driving means.

21. The apparatus of claim 20, further comprising a current monitoring device coupled to the speaker.

22. The apparatus of claim 19, in which the first driving means and the second driving means generates an asymmetrical output between the first output node and the second output node.

23. A method, comprising:
    receiving a signal; and modulating the signal onto a first node and a second node, comprising:

driving the first node at a first constant potential when the received signal is larger than a first threshold value and at a second constant potential when the received signal is smaller than a second threshold value, wherein the first constant potential is different from the second constant potential; and driving the second node by switching the second node between the first constant potential and the second constant potential corresponding to the received signal, wherein the second output node is switched between the first constant potential and the second constant potential while the first output node is held at either the first constant potential or the second constant potential.

24. The method of claim 23, in which the step of modulating the signal comprises modulating the signal according to at least one of a pulse-width modulation (PWM) scheme and a pulse-frequency modulation (PFM) scheme.

25. The method of claim 24, in which a first average voltage of the first node is different from a second average voltage of the second node.

26. The method of claim 24, in which the step of driving the first node comprises switching a voltage of the first node to change a direction of current from the first node to the second node, and in which the step of driving the second node comprises switching a voltage of the second node to represent a change of amplitude of the received signal.

27. The method of claim 26, in which the step of switching the first node comprises switching the first node at a rate between approximately 0 hertz and approximately 20 kilohertz, and in which the step of switching the second node comprises switching the second node at a rate between approximately 200 kilohertz and approximately 2 megahertz.

28. The method of claim 23, in which receiving the signal comprises receiving an audio signal, and in which the method further comprises driving a speaker with current from the first node and the second node.

29. The method of claim 28, further comprising monitoring current through the speaker comprises measuring current at the first node.

30. An apparatus, comprising:
a first driver configured to receive a first signal and to provide a first output to a first node;
a second driver configured to receive a second signal and to provide a second output to a second node; and
a processor coupled to the first driver and the second driver, the processor configured to perform the steps of:
outputting the first signal to the first driver to generate a first constant potential when a received signal is larger than a first threshold value and to generate a second constant potential when the received signal is smaller than a second threshold value, wherein the first constant potential is different from the second constant potential; and
outputting the second signal to the second driver by switching the second node between the first constant potential and the second constant potential corresponding to the received signal, wherein the second output node is switched between the first constant potential and the second constant potential while the first output node is held at either the first constant potential or the second constant potential,
in which the first signal is asymmetrical from the second signal.

31. The apparatus of claim 30, further comprising a speaker coupled to the first node and to the second node, in which the processor is further configured to perform the steps of:
receiving an audio signal; and
processing the audio signal to generate the first signal and the second signal.

32. The apparatus of claim 31, further comprising:
a resistor coupled to the first node and to the speaker; and
a current monitor coupled to the resistor.

33. The apparatus of claim 30, further comprising:
a first predriver coupled to the first driver; and
a second predriver coupled to the second driver.

34. The apparatus of claim 30, in which the processor is further configured to modulate the first signal and the second signal according to at least one of a pulse-width modulation (PWM) scheme and a pulse-frequency modulation (PFM) scheme.

35. The apparatus of claim 34, in which a first average voltage of the first signal is different from a second average voltage of the second signal.

36. The apparatus of claim 30, in which the processor is further configured to perform the steps of:
switching the first signal at a rate between approximately 0 hertz and approximately 20 kilohertz; and
switching the second signal at a rate between approximately 200 kilohertz and approximately 2 megahertz.

* * * * *